(12) United States Patent
Arvin et al.

(10) Patent No.: US 8,803,317 B2
(45) Date of Patent: Aug. 12, 2014

(54) STRUCTURES FOR IMPROVING CURRENT CARRYING CAPABILITY OF INTERCONNECTS AND METHODS OF FABRICATING THE SAME

(75) Inventors: Charles L. Arvin, Poughkeepsie, NY (US); Raschid J. Bezama, Mahopac, NY (US); Harry D. Cox, Rifton, NY (US); Timothy H. Daubenspeck, Colchester, VT (US); Krystyna W. Semkow, Poughquang, NY (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/433,974

(22) Filed: Mar. 29, 2012

(65) Prior Publication Data

US 2012/0187558 A1 Jul. 26, 2012

Related U.S. Application Data

(62) Division of application No. 12/421,723, filed on Apr. 10, 2009.

(51) Int. Cl.
*H01L 23/48* (2006.01)
*H01L 23/52* (2006.01)
*H01L 29/40* (2006.01)
*H01L 21/44* (2006.01)
*H01L 23/00* (2006.01)

(52) U.S. Cl.
CPC .......... *H01L 24/05* (2013.01); *H01L 2924/014* (2013.01); *H01L 2224/13099* (2013.01); *H01L 2224/05647* (2013.01); *H01L 2224/05655* (2013.01); *H01L 2224/05075* (2013.01); *H01L 2224/0401* (2013.01); *H01L 2224/05147* (2013.01); *H01L 2224/05155* (2013.01)
USPC ........... 257/737; 257/738; 257/751; 257/752; 257/781; 257/E23.021; 438/613; 438/614

(58) Field of Classification Search
CPC .............. H01L 2924/014; H01L 2224/13099; H01L 2224/05647; H01L 2224/05655; H01L 2224/05075; H01L 24/05; H01L 2224/05147; H01L 2224/05155; H01L 2224/0401
USPC ......... 257/734–738, 748, 750, 762, 778–783, 257/E21.174, E21.175, E21.508, E23.021, 257/E23.068, E23.145; 438/612–615, 438/652–654, 959
See application file for complete search history.

(56) References Cited

U.S. PATENT DOCUMENTS 5,291,019 A * 3/1994 Powell et al. .............. 250/338.4
5,736,456 A 4/1998 Akram
(Continued)

FOREIGN PATENT DOCUMENTS

JP 2001298037 10/2001
JP 2004214345 7/2004
(Continued)

OTHER PUBLICATIONS

S. K. Kang, R. S. Rai, S. Purushothaman; Interfacial reactions during soldering with lead-tin eutectic and lead (Pb)-free, tin-rich solders, Journal of Electronic Materials, Jul. 1996, vol. 25, Issue 7, pp. 1113-1120.*
(Continued)

*Primary Examiner* — Fernando L Toledo
*Assistant Examiner* — Aaron Gray
(74) *Attorney, Agent, or Firm* — Steven Meyers; Roberts Mlotkowski Safran & Cole, P.C.

(57) ABSTRACT

Interconnect structures and methods of fabricating the same are provided. The interconnect structures provide highly reliable copper interconnect structures for improving current carrying capabilities (e.g., current spreading). The structure includes an under bump metallurgy formed in a trench. The under bump metallurgy includes at least: an adhesion layer; a plated barrier layer; and a plated conductive metal layer provided between the adhesion layer and the plated barrier layer. The structure further includes a solder bump formed on the under bump metallurgy.

15 Claims, 11 Drawing Sheets

(56) References Cited

U.S. PATENT DOCUMENTS

| | | | |
|---|---|---|---|
| 6,362,090 B1 * | 3/2002 | Paik et al. | 438/614 |
| 6,578,754 B1 | 6/2003 | Tung | |
| 6,592,019 B2 | 7/2003 | Tung | |
| 7,087,458 B2 | 8/2006 | Wang et al. | |
| 2003/0211720 A1 * | 11/2003 | Huang et al. | 438/613 |
| 2004/0130034 A1 | 7/2004 | Alvarez | |
| 2004/0134974 A1 | 7/2004 | Oh | |
| 2004/0164409 A1 | 8/2004 | Schammler et al. | |
| 2006/0016861 A1 | 1/2006 | Daubenspeck et al. | |
| 2006/0030139 A1 * | 2/2006 | Mis et al. | 438/612 |
| 2006/0087034 A1 | 4/2006 | Huang et al. | |
| 2006/0088992 A1 | 4/2006 | Huang et al. | |
| 2006/0094226 A1 | 5/2006 | Huang et al. | |
| 2007/0023923 A1 | 2/2007 | Salmon | |
| 2007/0052109 A1 | 3/2007 | Chen et al. | |
| 2007/0111499 A1 | 5/2007 | Lo | |
| 2007/0184579 A1 | 8/2007 | Huang et al. | |
| 2007/0264519 A1 | 11/2007 | Kinzer | |
| 2007/0283298 A1 * | 12/2007 | Bernstein et al. | 716/1 |

FOREIGN PATENT DOCUMENTS

| | | |
|---|---|---|
| JP | 2005333007 | 12/2005 |
| JP | 2008543035 | 11/2008 |
| JP | 2009524928 | 7/2009 |
| JP | 2010518637 | 5/2010 |
| WO | 2008100923 | 8/2008 |

OTHER PUBLICATIONS

Office Action dated May 14, 2014 in related U.S. Appl. No. 12/421,723, 10 pages.

* cited by examiner

STRUCTURES FOR IMPROVING CURRENT CARRYING CAPABILITY OF INTERCONNECTS AND METHODS OF FABRICATING THE SAME

CROSS REFERENCE TO RELATED APPLICATIONS

The present application is a divisional application of co-pending U.S. application Ser. No. 12/421,723, filed on Apr. 10, 2009, the contents of which are incorporated by reference in its entirety herein.

FIELD OF THE INVENTION

The present invention relates generally to interconnect structures and methods of fabricating the same. More particularly, the present invention provides highly reliable copper interconnect structures for improving current carrying capabilities (e.g., current spreading) and methods of fabricating the same.

BACKGROUND

Traditionally, C4 (Controlled Collapse Chip Connection) bumps have been used to bond a chip to a chip carrier (substrate). The C4 bumps (solder bumps) can be made from conventional lead tin solder or newer lead-free solder mixtures. During the fabrication process, the C4 bumps are connected to an under bump metallurgy (UBM), which is the critical interface between the metal pad of the IC and the solder bump (C4). The UBM consists of many layers including, for example, sputtered TiW and Cu and plated Ni. The UBM must be reliable and robust in order to withstand reflowing of the C4 bumps. For without such robustness, the UBM can fail, e.g., result in an unacceptable undercut in a metal layer that can affect the current carrying capabilities of the entire structure. Currently, UBM structures include current density peaks which impact device performance due to electromigration effects.

In lead-free C4 bumps, solder interconnects consist of tin/copper, tin/silver and SAC alloys as a replacement for leaded solder interconnects. However, lead-free C4 bumps have higher melting points and stiffness compared to eutectic leaded solders. This results in a transfer of stress through the C4 joint during the assembly process (e.g., during a cooling cycle after reflow). This transfer of stress results in cracks in chip metallurgy under C4 bumps, which are named "white bumps" due to their appearance in sonoscan type inspection processes. These white bumps, in turn, can affect the current carrying capabilities of the C4 joint by placing a higher than average current density at other locations of the C4 joint. In the best case scenario, this leads to device impairment and in the worst case scenario this leads to a device failure.

It is also known that the current density in interconnect structures increases due to scaling of the structures. This increased current density degrades EM (electromigration) related reliability, which becomes an increasing concern as the size of the integrated circuit (IC) decreases. For example, as the size of the C4 bump continues to shrink, the peak current density in the UBM will dictate the time to fail for the C4 bump. For example, existing C4 bumps are already reaching their current limit at, for example, approximately 100 mA (e.g., for ASIC), approximately 200 mA (e.g., for organic servers) and approximately 300 mA (e.g., for ceramic). But, new trends to reduce the current size, as well as eliminate the underlying Al layer of the structure, will have a direct impact on the future C4 bumps' maximum current capability.

In view of the above, the effect of electromigration is an important consideration to take into account in applications where high direct current densities are used, such as in microelectronics and related structures. In fact, as noted above, electromigration is known to decrease the reliability of integrated circuits (ICs) and hence lead to a malfunction of the circuit. In the worst case, for example, electromigration leads to the eventual loss of one or more connections and intermittent failure of the entire circuit. Thus, with increasing miniaturization the probability of failure due to electromigration increases in VSLI and USLI circuits because both the power density and the current density increase. Also, due to the increased electromigration is has not been practical to: (i) eliminate the aluminum layer in the structure or (ii) remove Ag from the C4 structure or laminate or both, which would otherwise reduce white bump issues.

Also, back-end-of-line (BEOL) interconnects, consisting of metal wires and inter-level vias, carry high direct current (DC) in advanced integrated circuit (IC) chip technology. In particular, as IC chip technology advances, the current density required in these metal wires/vias increases with the ever-decreasing dimensions in IC chip technology. Also, self-heating by high current devices raises the temperature of nearby interconnects under circuit operation and makes use of high current carrying BEOL interconnects extremely challenging. For example, a device that uses high current and self-heats (e.g., a resistor, a bipolar transistor, etc.) may heat up an interconnect wire that couples to the device. The high current leads to electro-migration (EM) degradation of the interconnect (via and/or line), causing shorts or opens.

As a result, the current-carrying capability (or the $I_{dc}$ limit specified in the design manuals) is significantly reduced to avoid electro-migration degradation in interconnects. As an example, a direct current limit in a copper interconnect may be reduced by a factor of more than three resulting from a temperature rise of about 15° C. from, for example, 85° C. to 100° C., and by almost a factor of 20 at a 125° C. interconnect temperature. As a result, high direct current at elevated temperatures is almost impossible with conventional interconnect structures.

Accordingly, there exists a need in the art to overcome the deficiencies and limitations described hereinabove.

SUMMARY

In a first aspect of the invention, a structure comprises an under bump metallurgy formed in a trench. The under bump metallurgy includes at least: an adhesion layer; a plated barrier layer; and a plated conductive metal layer provided between the adhesion layer and the plated barrier layer. The structure further includes a solder bump formed on the under bump metallurgy.

In another aspect of the invention, a method of fabricating a structure comprises forming an under bump metallurgy in a trench and reflowing a solder bump on the under bump metallurgy. The forming of the under bump metallurgy comprises: sputtering an adhesion layer on an upper layer of the trench; plating a nickel layer over the sputtered adhesion layer; plating a copper layer on the plated nickel layer; and plating a nickel layer on the plated copper layer.

In yet a still further aspect of the invention, a design structure is embodied in a machine-readable medium for designing, manufacturing, or testing an integrated circuit. The design structure comprises an under bump metallurgy formed in a trench. The under bump metallurgy includes at least: an adhesion layer; a plated barrier layer; and a plated conductive metal layer provided between the adhesion layer and the plated barrier layer. The structure further includes a solder bump formed on the under bump metallurgy.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The present invention relates generally to interconnect structures and methods of fabricating the same. More particularly, the present invention provides highly reliable copper interconnect structures for improving current carrying capabilities (e.g., current spreading) and methods of fabricating the same. In embodiments, the structure of the present invention will improve current spreading within the BLM (Ball Limiting Metallurgy also known as Under Bump Metallurgy (UBM)). The structure of the present invention also stabilizes the intermetallics of the UBM to reduce sputtered Cu undercut formations thereby allowing use of solder combinations that reduce the propensity of white bump formation and further improves current spreading capabilities.

In a typical UBM, solder intermetallic grains create electrical current preferential paths with higher than average current density. These paths lead to potential detrimental impact to the C4 current carrying capability and conversely to the C4 reliability since localized areas are above the average current density. The present invention addresses this issue by, for example, in embodiments, using a plated copper layer to increase the thickness of a highly conductive layer between an adhesion layer and barrier layer. This is designed to spread out the localized current density through the under bump metallurgy (UBM) and thereby reduce or eliminate high current paths through the intermetallic phase on top of the barrier layer.

In further embodiments, the present invention maintains the presence of the barrier layer or adds an additional barrier layer above the highly conductive layer to preserve the intermetallics that form from a higher resistivity and more contiguous layer than those of, for example, $Cu_xSn_y$. This will also limit the consumption of the sputtered Cu layer in the UBM, which leads to an approximate 5% reduction in volume compared to pure Cu and Sn. In alternative embodiments, the maximum current capacity can be reduced by increasing the number of power C4 bumps.

First Aspect of the Invention

Figure 1:
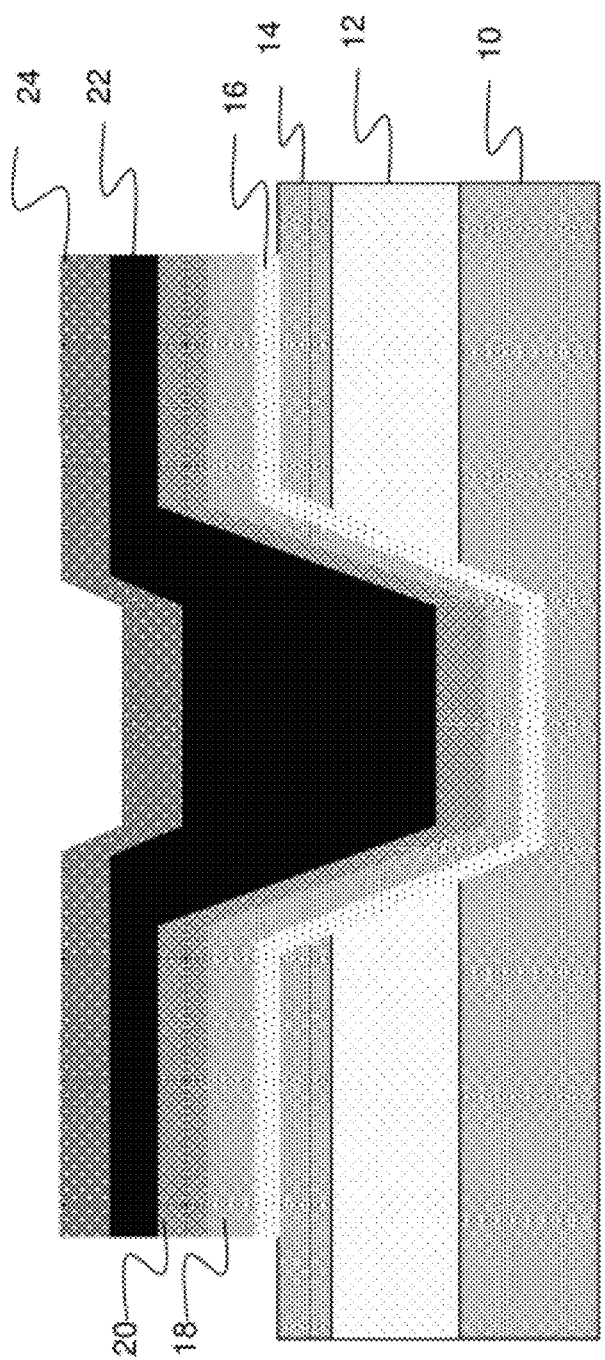
FIGS. 1 and 2 show fabrication processes and respective structures for manufacturing a structure in accordance with a first aspect of the invention.
Figure 2:
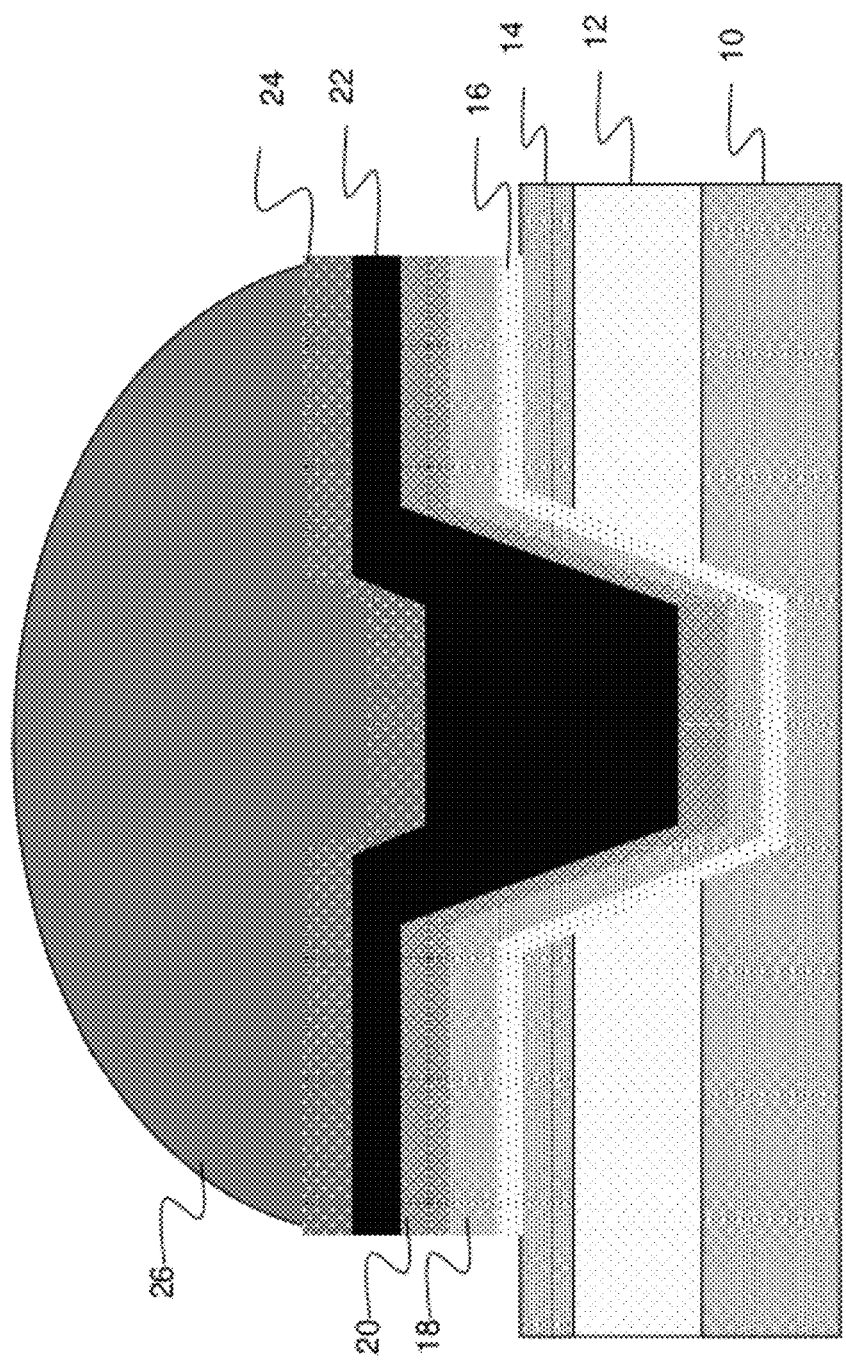

FIGS. 1 and 2 show fabrication processes and respective structures for manufacturing a structure in accordance with a first aspect of the invention. In particular, the exemplary embodiment shown in FIG. 1 includes an aluminum layer 10, an oxide-nitride passivation layer 12 and a polyimide layer 14. Those of skill in the art will understand that the layers 10, 12, 14 can include other combinations of layers, known to those of skill in the art. As such, the present invention should not be limited to the exemplary layers 10, 12, 14 shown in FIG. 1.

Still referring to FIG. 1, a trench is formed in the layers 10, 12, 14 using any conventional lithography and etching process. For example, a mask (not shown) may be applied over the layers 10, 12, 14 and exposed to light to form an opening. A reactive ion etching (RIE) may then be performed to form the trench. In embodiments, the trench can be approximately 50 microns in width (e.g., diameter); although, other dimensions are also contemplated by the present invention.

With all aspects of the invention, multiple trenches (vias) can be added to aid in the development of a via fill Cu bath. (See, for example, FIG. 7.) Typically, an aspect ratio of thickness to opening needs to be around 1:1; although an aspect ratio (thickness to opening) for filling a via can be around 0.5 in an organic laminate. In embodiments, two thicknesses and two openings are typically of concern. Specifically, the two thicknesses are the polyimide and final deposit (Cu thickness). In embodiments, the polyimide is around 7 microns, but can be up to 12 or 13 microns for stress issues. The two openings are the via and the opening in the photoresist during plating. The via can be about 47 microns, and the photoresist opening can range between 85 to 120 microns (e.g., an 85 um opening leads to a ratio of 10/85=0.11). The opening in the photoresist is dependent upon the C4 size being plated and, in embodiments, may be reduced to about 25 microns or 10 microns for some advanced applications. As the pad diameter moves closer to the thickness of the pedestal, a via fill bath would compensate for such diameters. This means that if the photoresist opening was 20 microns and the pedestal thickness remained 10 microns, then there is the chance to make it flat.

In current embodiments, the aspect ratio is about 0.14 as the polymide is about 7 microns thick and the via opening is about 47 microns, e.g., aspect ratio is 7/47=0.14. At 13 um thickness, the ratio becomes 13/47=0.27. At a 30 micron thickness the aspect ratio is 30/47=0.63. If a 10 micron via is used, the ratio is 13/10=1.3 and if the thickness of about 7 microns is used, a resultant aspect ratio is 7/10=0.7. Thus, the smaller/multiple vias allow the use of existing via fill baths.

In embodiments, the trench is filled with several different layers which form an under bump metallurgy, using conventional sputtering and plating techniques. For example, a TiW layer 16 is sputtered on the layer 14. In embodiments, the sputtered TiW layer 16 is approximately 0.125 to 0.45 microns in thickness. A copper (Cu) layer 18 is sputtered on the TiW layer 16. The sputtered copper layer 18 is preferably approximately 0.2 microns in thickness, but can range from approximately 0.25 to 0.6 microns in thickness.

The Cu layer 18 provides an additional benefit with regard to electromigration (electromigration is dependent upon the peak current density and the temperature of operation, with the peak current density location being thought of as a heat source.) Due to joule heating (power=(current)^2*resistance), the area of peak current density begins to heat. Even though the entire C4 does not participate in spreading the current, it does participate in spreading the heat. Thus, the temperature at the peak current density location is reduced due to the additional heat spreading of the Cu layer 18. This effect may only be a few degrees C.; however, this is enough of a delta to start impacting EM performance.

A nickel layer 20 is plated on the sputtered copper layer 18. The plated nickel layer 20 is approximately 1 micron in thickness, but can also be other thicknesses depending on the particular application and design criteria. The plated nickel layer 20 protects the underlying sputtered copper layer 18, for example, during reflowing processes. That is, the plated nickel layer 20 will prevent consumption (e.g., undercutting) of the underlying sputtered copper layer 18, for example, during reflowing processes of a solder metallurgy (solder ball). This, in turn, will prevent electromigration impacts on the final device.

A copper layer 22 is plated on the plated nickel layer 20. The plated copper layer 22 is designed to spread the current more evenly in the device, compared to conventional metallurgies. That is, the plated copper layer 22, which is a highly conductive layer between the adhesion layer and an upper barrier layer, e.g., plated nickel layer, will spread out the localized density through the under bump metallurgy. This will reduce or eliminate the high current density paths through intermetallic phase on top of the barrier layer. For example, the plated copper layer 22 will allow the current to spread across the under bump metallurgy prior to reaching the interface between the under bump metallurgy and solder.

In embodiments, the plated copper layer 22 is preferably 5 to 10 microns in thickness, but can range from 0.25 microns to upwards of 10 microns. For example, the plated copper layer 22 can be, for example, 1 micron, 2 microns or 5 microns in thickness in some contemplated embodiments. In further embodiments, the target thickness can be, for example, 10 um with +/−1 um, and can even include about as high as 12 um depending upon process window studies on white bumps. As shown in FIG. 1, for example, the plated copper layer 22 is non-planar (forming a via depression).

A nickel layer 24 (barrier layer) is plated over the plated copper layer 22. The plated nickel layer 24 should be about 1 micron in thickness; however, larger dimensions are also contemplated by the present invention. For example, the plated nickel layer 24 can range from about 1 micron to upwards of about 4 microns, as well as other contemplated thicknesses such as about 0.5 to 3.5 microns. The plated nickel layer 24 is designed to protect the underlying copper layers 18 and 22, for example, during reflowing processes. That is, the plated nickel layer 24 will prevent consumption (e.g., undercutting) of the underlying copper layers 18 and 22, thereby preventing electromigration effects from occurring to the device. In embodiments, the present invention can also utilize electrolytic Ni, e.g., NiCo, as well as Ni alloy plating. From a perspective of a barrier layer, Ni or a Ni alloy would also be a valid selection.

FIG. 2 shows additional processing steps and a respective structure in accordance with aspects of the invention. As shown in FIG. 2, a solder ball 26 is reflowed onto the structure of FIG. 1 and more particularly over the plated nickel layer 24. In embodiments, the solder ball 26 can be a tin lead or lead-free metallurgy. In the tin lead embodiment (or other embodiments using tin), the reflowing process causes the tin to be consumed thereby having little to no affect on the plated nickel layer 24.

The reflow of the solder bal 26 will result in a stable intermetallic composition with the nickel such as, for example, NiSn. This is due to a phase transformation. Thus, the presence of the barrier layer (e.g., plated nickel layer 24) above the highly conductive layer (e.g., plated copper layer 22) preserves the intermetallics, which form a higher resistivity and more contiguous layer than those of $Cu_xSn_y$. The intermetallic of NiSn will also improve the reliability of the device, e.g., decrease electromigration impact.

Second Aspect of the Invention

Figure 3:
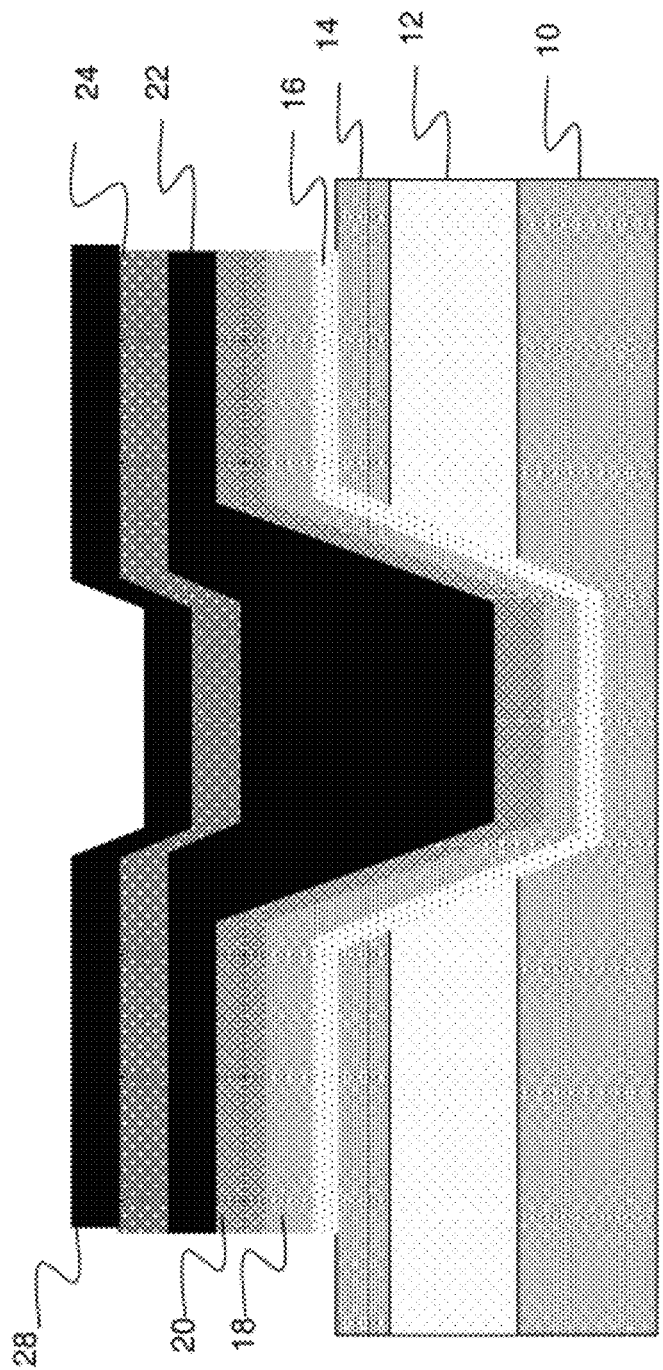
FIGS. 3 and 4 show fabrication processes and respective structures for manufacturing a structure in accordance with a second aspect of the invention.
Figure 4:
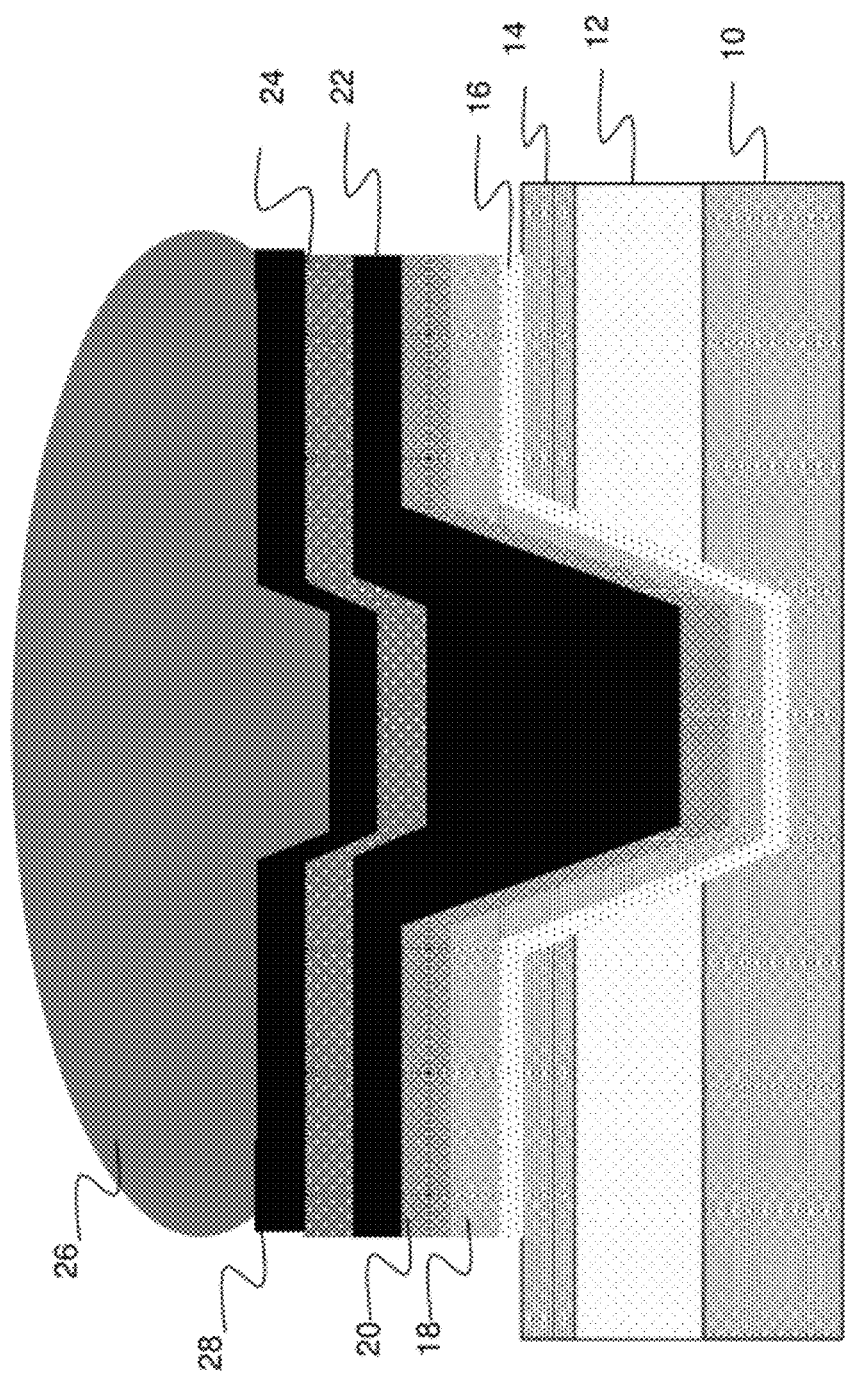

FIGS. 3 and 4 show fabrication processes and respective structures for manufacturing a structure in accordance with a second aspect of the invention. Similar to the first aspect of the invention, the exemplary embodiment shown in FIG. 2 includes an aluminum layer 10, an oxide-nitride passivation layer 12 and a polyimide layer 14; although other combinations of layers, known to those of skill in the art, are also contemplated by the invention. As such, the present invention should not be limited to these exemplary layers shown in FIG. 3.

Still referring to FIG. 3, a trench is formed in the layers 10, 12 and 14 using any conventional lithography and etching process as discussed above. In embodiments, the trench is filled with several different layers which form an under bump metallurgy using conventional sputtering and plating techniques. For example, a TiW layer 16 is sputtered on the layer 14. In embodiments, the sputtered TiW layer 16 is approximately 0.125 to 0.45 microns in thickness. A copper (Cu) layer 18 is sputtered on the TiW layer 16. The sputtered copper layer 18 is preferably approximately 0.2 microns in thickness, but can range from approximately 0.25 to 0.6 microns in thickness. A nickel layer 20 is plated on the sputtered copper layer 18. The plated nickel layer 20 is approximately 1 micron in thickness, but can also be of a larger thickness depending on the particular application and design criteria. As previously discussed, the plated nickel layer 20 is designed to protect the underlying sputtered copper layer 18, for example, during reflowing processes. This is designed to prevent electromigration impacts on the final device. The Ni layer can also be sputtered, in embodiments.

A copper layer 22 is plated on the plated nickel layer 20. As previously discussed, the plated copper layer 22 is designed to spread the currently more evenly in the device, compared to conventional metallurgies. That is, the plated copper layer 22, which is a highly conductive layer, will spread out the localized density through the under bump metallurgy. This will reduce or eliminate the high current density paths through intermetallic phase on top of the barrier layer. For example, the plated copper layer 22 will allow the current to spread across the under bump metallurgy prior to reaching the interface between the under bump metallurgy and solder.

In embodiments, the plated copper layer 22 is preferably 5 to 10 microns in thickness, but can range from 0.25 microns to upwards of 10 microns. For example, the plated copper layer 22 can be, for example, 1 micron, 2 microns or 5 microns in thickness in some contemplated embodiments. In further embodiments, the target thickness can be, for example, 10 um with +/−1 um, and can even include about as high as 12 um depending upon process window studies on white bumps. The plated copper layer 22 is non-planar forming a via depression.

A nickel layer 24 is plated over the plated copper layer 22. The plated nickel layer 24 should be about 1 micron in thickness; however, larger dimensions are also contemplated by the present invention. For example, the plated nickel layer 24 can range from about 2 microns to upwards of about 4 microns, as well as other contemplated thicknesses such as about 0.5 to 3.5 microns. Again, the plated nickel layer 24 is designed to protect the underlying copper layers 18 and 22, for example, during reflowing processes. In embodiments, the present invention can also utilize electrolytic Ni, e.g., NiCo, as well as Ni alloy plating. From a perspective of a barrier layer, Ni or a Ni alloy would also be a valid selection.

A plated copper layer 28 is provided on the plated nickel layer 24. The plated copper layer 28 is preferably a finishing/solder wettable layer. The plated copper layer 28 can range in thickness from about 0.2 microns to about 1 micron; although, other dimensions are also contemplated by the present invention.

FIG. 4 shows additional processing steps and a respective structure in accordance with aspects of the invention. As shown in FIG. 4, a solder ball 26 reflows onto the structure of FIG. 3 and more particularly over the plated copper layer 28. In embodiments, the solder ball 26 can be a tin lead or lead-free metallurgy. In the tin lead embodiment (or other embodiments using tin), the reflowing process causes the tin to be consumed thereby having little to no affect on the plated nickel layer 24.

By reflowing the solder ball 26 over the plated copper layer 28, a stable intermetallic composition of, for example, CuSn, NiCuSn, etc. results due to a phase transformation. The presence of the barrier layer (e.g., plated nickel layer 24) above the highly conductive layer (e.g., plated copper layer 22) preserves the intermetallics, which form a higher resistivity and more contiguous layer than those of $Cu_xSn_y$. The intermetallic of CuSn, NiCuSn, etc. will thereby improve the reliability of the device, e.g., decrease electromigration impact.

Third Aspect of the Invention

Figure 5:
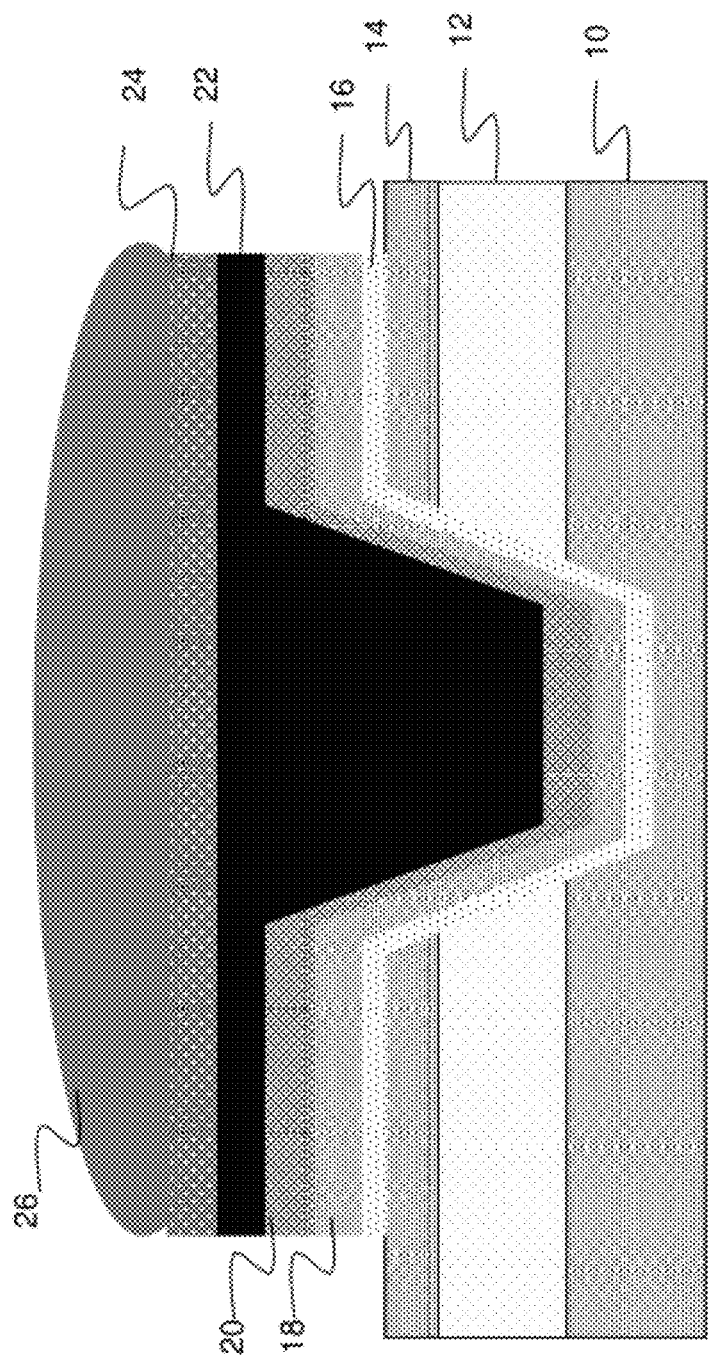
FIG. 5 shows fabrication processes and a respective structure for manufacturing a structure in accordance with a third aspect of the invention.

FIG. 5 shows fabrication processes and a respective structure for manufacturing a structure in accordance with a third aspect of the invention. Similar to the first and second aspect of the invention, the exemplary embodiment shown in FIG. 5 includes an aluminum layer 10, an oxide-nitride passivation layer 12 and a polyimide layer 14; although other combinations of layers, known to those of skill in the art, are also contemplated by the invention. As such, the present invention should not be limited to these exemplary layers shown in FIG. 5.

Still referring to FIG. 5, a trench is formed in the layers 10, 12, 14 using any conventional lithography and etching process as discussed above. In embodiments, the trench is filled with several different layers which form an under bump metallurgy using conventional sputtering and plating techniques. For example, a TiW layer 16 is sputtered on the layer 14. In embodiments, the sputtered TiW layer 16 is approximately 0.125 to 0.45 microns in thickness. A copper (Cu) layer 18 is sputtered on the TiW layer 16. The sputtered copper layer 18 is preferably approximately 0.2 microns in thickness, but can range from approximately 0.25 to 0.6 microns in thickness. A nickel layer 20 is plated on the sputtered copper layer 18. The plated nickel layer 20 is approximately 1 micron in thickness, but can also be other thicknesses depending on the particular application and design criteria. As previously discussed, the plated nickel layer 20 is designed protect the underlying sputtered copper layer 18, for example, during reflowing processes thereby prevent electromigration impacts on the final device. The Ni layer can also be sputtered, in embodiments.

A copper layer 22 is plated on the plated nickel layer 20. In this embodiment, the plated copper layer 22 is formed using a copper bath. This copper bath can be provided by, for example, using conventional BEOL (back end of the line) damascene processes. The copper bath results in a planar upper surface of the plated copper layer 22, which can be used to eliminate chemical mechanical polishing (CMP) processes. Also, the use of the fill bath can result in a thicker copper layer, (e.g., eliminating the via depression) thereby further improving the current spreading capabilities of the under bump metallurgy. It is important to note that a via fill bath has not previously been implemented on the under bump metallurgy for at least two reasons: (i) the traditional activity within the semiconductor areas has been dual damascene followed by CMP to flatten copper, and (ii) the via fill baths must be optimized based upon the via ranges which have traditionally been different in the filled via for laminate plating.

The plated copper layer 22 is designed to spread the currently more evenly in the device, compared to conventional metallurgies. That is, the plated copper layer 22, which is a highly conductive layer, will spread out the localized density through the under bump metallurgy. This will reduce or eliminate the high current density paths through intermetallic phase on top of the barrier layer. For example, the plated copper layer 22 will allow the current to spread across the under bump metallurgy prior to reaching the interface between the under bump metallurgy and solder.

In embodiments, the plated copper layer 22 is preferably 5 to 10 microns in thickness, but can range from 0.25 microns to upwards of 10 microns. For example, the plated copper layer 22 can be, for example, 1 micron, 2 microns or 5 microns in thickness in some contemplated embodiments. In further embodiments, the target thickness can be, for example, 10 um with +/−1 um, and can even include about as high as 12 um depending upon process window studies on white bumps.

Similar to the previous aspects of the invention, a plated nickel layer 24 is provided over the plated copper layer 22. As shown in FIG. 5, due to the copper bath process, the plated nickel layer 24 is also planar. The plated nickel layer 24 is designed to protect the underlying copper layers 18 and 22, for example, during reflowing processes, as discussed above. The plated nickel layer 24 should be about 1 micron in thickness; however, other thicknesses are also contemplated by the present invention. For example, the plated nickel layer 24 can range from about 2 microns to upwards of about 4 microns, as well as other contemplated thicknesses such as about 0.5 to 3.5 microns. Again, the plated nickel layer 24 is designed to protect the underlying copper layers 18 and 22, for example, during reflowing processes. In embodiments, the present invention can also utilize electrolytic Ni, e.g., NiCo, as well as Ni alloy plating. From a perspective of a barrier layer, Ni or a Ni alloy would also be a valid selection.

Still referring to FIG. 5, a solder ball 26 reflows over the plated nickel layer 24. In embodiments, the solder ball 26 can be a tin lead or lead-free metallurgy. In the tin lead embodiment (or other embodiments using tin), the reflowing process causes the tin to be consumed thereby having little to no affect on the plated nickel layer 24.

The reflow of the solder bal 26 will result in a stable intermetallic composition with the nickel such as, for example, NiSn. This is due to a phase transformation. Thus, the presence of the barrier layer (e.g., plated nickel layer 24) above the highly conductive layer (e.g., plated copper layer 22) preserves the intermetallics, which form a higher resistivity and more contiguous layer than those of $Cu_xSn_y$. The intermetallic of NiSn will thereby improve the reliability of the device, e.g., decrease electromigration impact.

Fourth Aspect of the Invention

Figure 6:
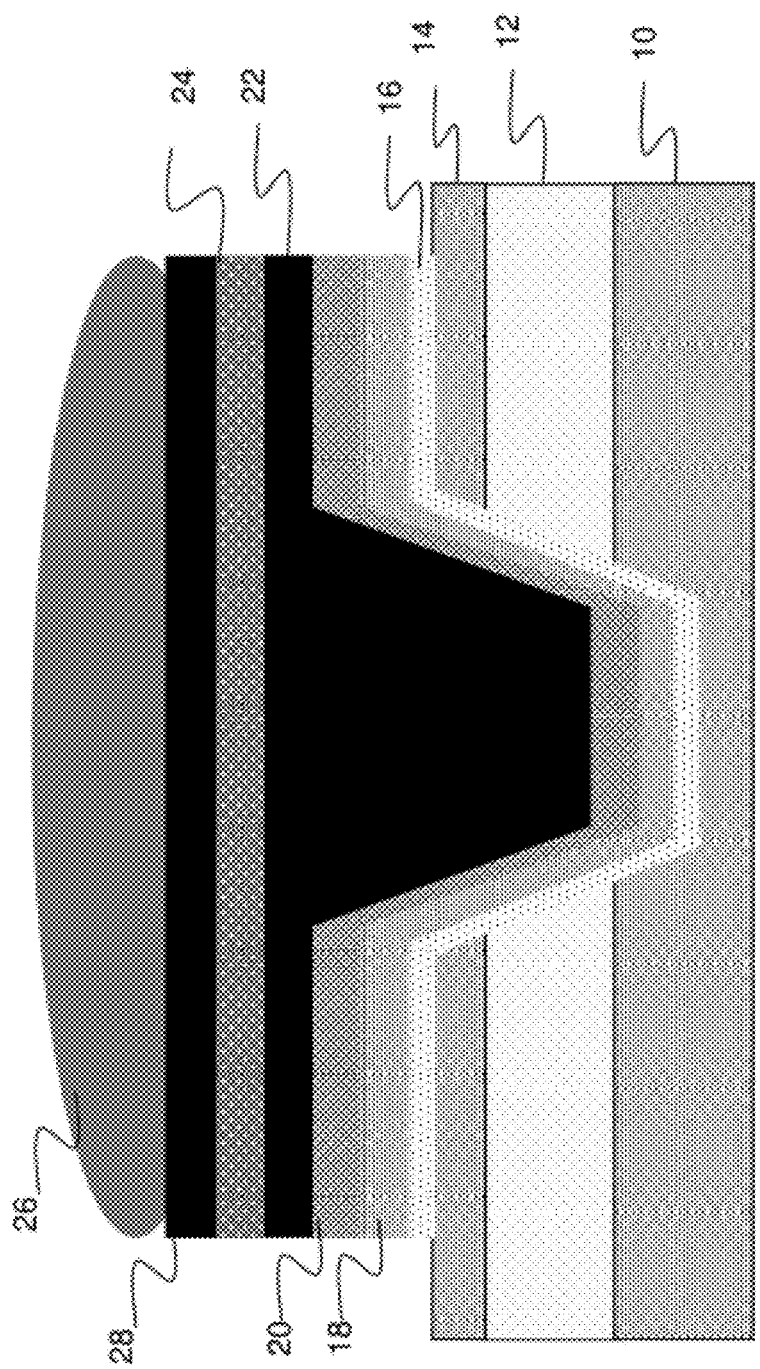
FIG. 6 shows fabrication processes and a respective structure for manufacturing a structure in accordance with a fourth aspect of the invention.

FIG. 6 shows fabrication processes and a respective structure for manufacturing a structure in accordance with a fourth aspect of the invention. Similar to the third aspect of the invention, the exemplary embodiment shown in FIG. 6 includes the structure of FIG. 5, in addition to a copper layer 28 plated on the plated nickel layer 24. In this aspect of the invention, the plated copper layer 22 is formed using a copper bath to provide a planar surface, thus eliminating the via depression. Thus, the use of the fill bath can result in a thicker copper layer, (e.g., eliminating the via depression) thereby further improving the current spreading capabilities of the under bump metallurgy. The plated copper layer 28 is preferably a finishing/solder wettable layer. The plated copper layer 28 can range in thickness from about 0.2 microns to about 1 microns; although, other dimensions are also contemplated by the present invention.

Similar to previous embodiments, a plated nickel layer 24 is provided over the plated copper layer 22. As shown in FIG. 6, due to the copper bath process, the plated nickel layer 24 is also planar. The plated nickel layer 24 is designed to protect the underlying copper layers 18 and 22, for example, during reflowing processes, as discussed above. The plated nickel layer 24 should be about 1 micron in thickness; however, other thicknesses are also contemplated by the present invention. For example, the plated nickel layer 24 can range from about 2 microns to upwards of about 4 microns, as well as other contemplated thicknesses such as about 0.5 to 3.5 microns. Again, the plated nickel layer 24 is designed to protect the underlying copper layers 18 and 22, for example, during reflowing processes.

A plated copper layer 28 is provided over the plated nickel layer 24. As shown in FIG. 6, the plated copper layer 28 is also planar.

Still referring to FIG. 6, a solder ball 26 reflows over the plated copper layer 28. In embodiments, the solder ball 26 can be a tin lead or lead-free metallurgy. In the tin lead embodiment (or other embodiments using tin), the reflowing process causes the tin to be consumed thereby having little to no affect on the plated nickel layer 24.

The reflow of the solder bal 26 will result in a stable intermetallic composition with the nickel and copper such as, for example, CuSn, NiCuSn, etc. Thus, the presence of the barrier layer (e.g., plated nickel layer 24) above the highly conductive layer (e.g., plated copper layer 22) preserves the intermetallics, which form a higher resistivity and more contiguous layer than those of $Cu_xSn_y$. The intermetallic of CuSn, NiCuSn, etc. will thereby improve the reliability of the device, e.g., decrease electromigration impact.

Fifth Aspect of the Invention

Figure 7:
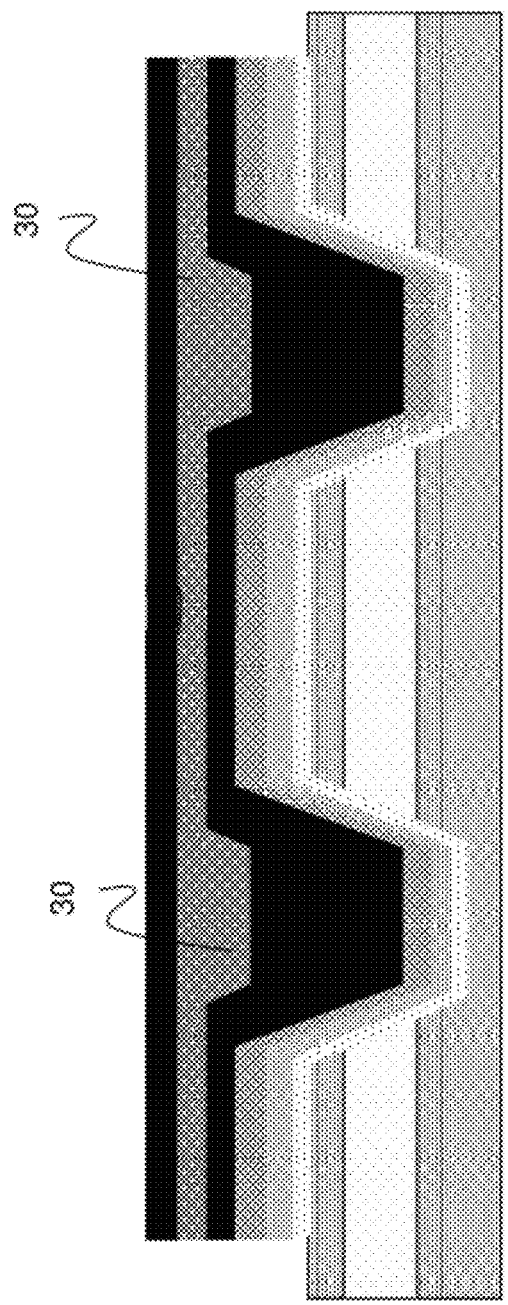
FIG. 7 shows fabrication processes and a respective structure for manufacturing a structure in accordance with a fifth aspect of the invention.

FIG. 7 shows fabrication processes and a respective structure for manufacturing a structure in accordance with a fifth aspect of the invention. Similar to previous aspects of the invention, the exemplary embodiment shown in FIG. 7 includes the layers shown in FIG. 4 or 6, in addition to two UBM structures 30. In the embodiment of FIG. 7, two or more UBM structures 30 (e.g., with multiple vias with aspect ratios and related features as discussed above) are contemplated by the invention.

The UBM structures 30 of FIG. 7 show an upper plated nickel layer 24 which has been planarized using, for example, a chemical mechanical polishing process. This results in a planar surface. Those of skill in the art should understand that the plated nickel layer 24 of any of the embodiments of the present invention can undergo a similar process. FIG. 7 also shows an upper plated copper layer 28 which has a planar surface. Although not shown, it should also be understood that a solder ball 26 reflows over the plated copper layer 28. In embodiments, the solder ball 26 can be a tin lead or lead-free metallurgy. In the tin lead embodiment (or other embodiments using tin), the reflowing process causes the tin to be consumed thereby having little to no affect on the plated nickel layer 24.

In further contemplated embodiments, instead of a sandwiched structure of having a layer of Ni followed by thick Cu covered by Ni and then capped with Cu, it is also possible to have only thick Ni (e.g., about 10 um) capped with Cu. The benefits to such a design include less overall costs since Ni is about 15 times less expensive than Cu. At present time, the primary difference in costs is due to the need to constantly dump the Cu bath (15% per day); whereas Ni baths can be used for years at a time. This also allows fewer movements through the plating tool which might lead to quicker processing time or the ability to utilize more plating tools (i.e., known existing plating tools plate a maximum of three plating layers).

Modeling and Graphs

Figure 8:
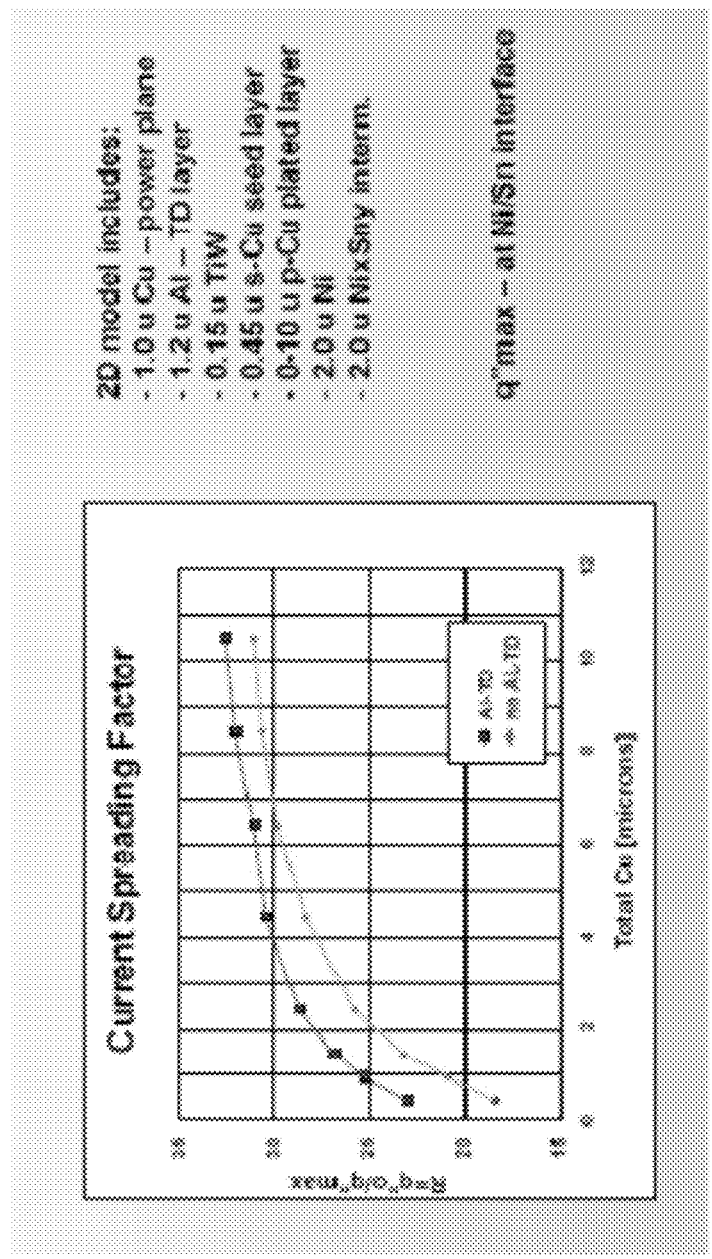
FIG. 8 shows a graph of a current spreading factor using modeling parameters noted thereon in accordance with aspects of the invention.

FIG. 8 shows a graph of a current spreading factor using modeling parameters noted thereon in accordance with aspects of the invention. More specifically, FIG. 8 shows the impact of the thick plated copper layer over the TiW layer. In this model, the x-axis represents the total thickness of the copper layer in microns and the y-axis represents the spreading factor. Also, the lines in the graph represent a structure with an Al TD (layer) and a structure without an AD TD.

As shown, the spreading factor increases with an increase in copper thickness in both structures. In fact, FIG. 8 shows an approximate 33% improvement for the structure with the Al TD and a 78% improvement for the non-AL TD structure. For example, in the AL TD structure, the current capacity increases from approximately 140 mA to about 187 mA (which is much closer to the desired goal of 250 mA range than a conventional structure).

Also, it has been observed in electromigration tests, that a structure comprising a plated copper layer of 1 micron had a life of greater than 1500 hours, compared to a structure without the plated copper layer which had a life expectancy of only about 600 hours, prior to failure due to electromigration effects. Additionally, it has been observed that using the copper fill baths can reduce the peak current density by about 18%.

Figure 9:
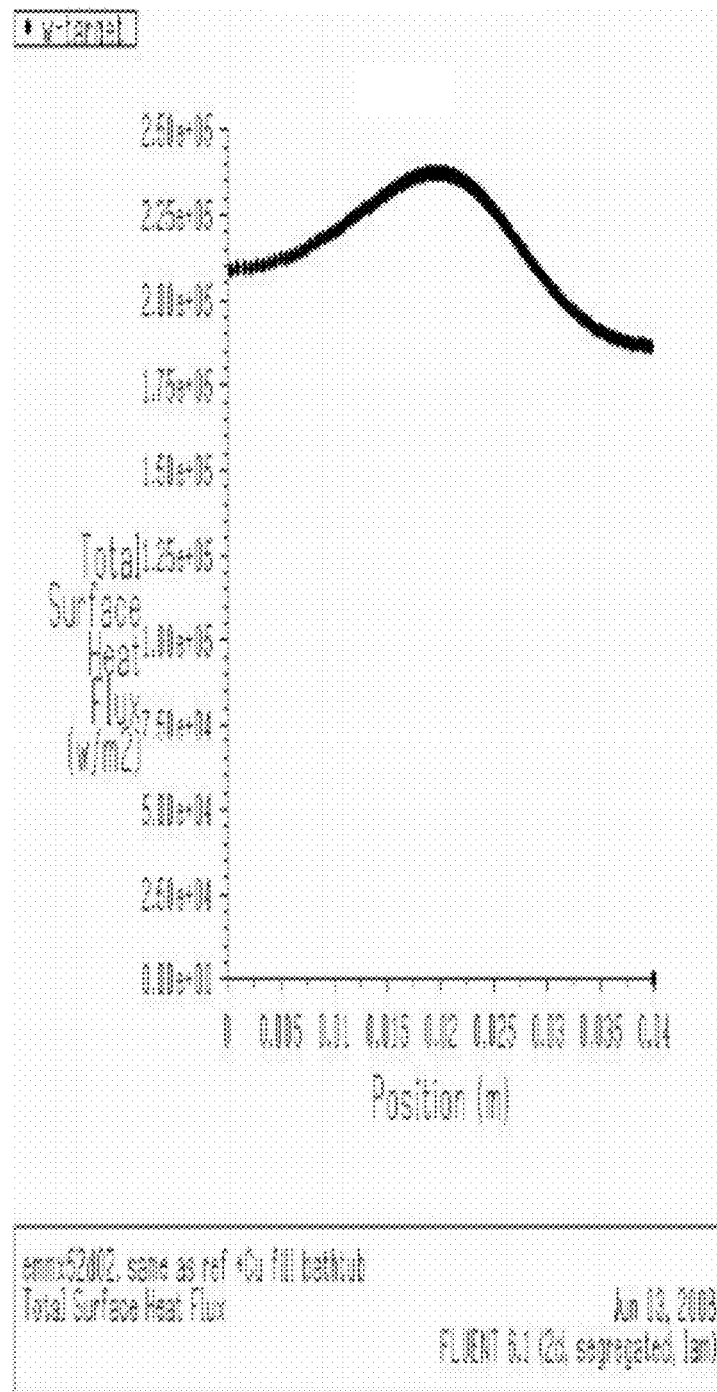
FIGS. 9 and 9a (hereinafter referred to as FIG. 9) show in accordance with aspects of the invention.
Figure 9A:
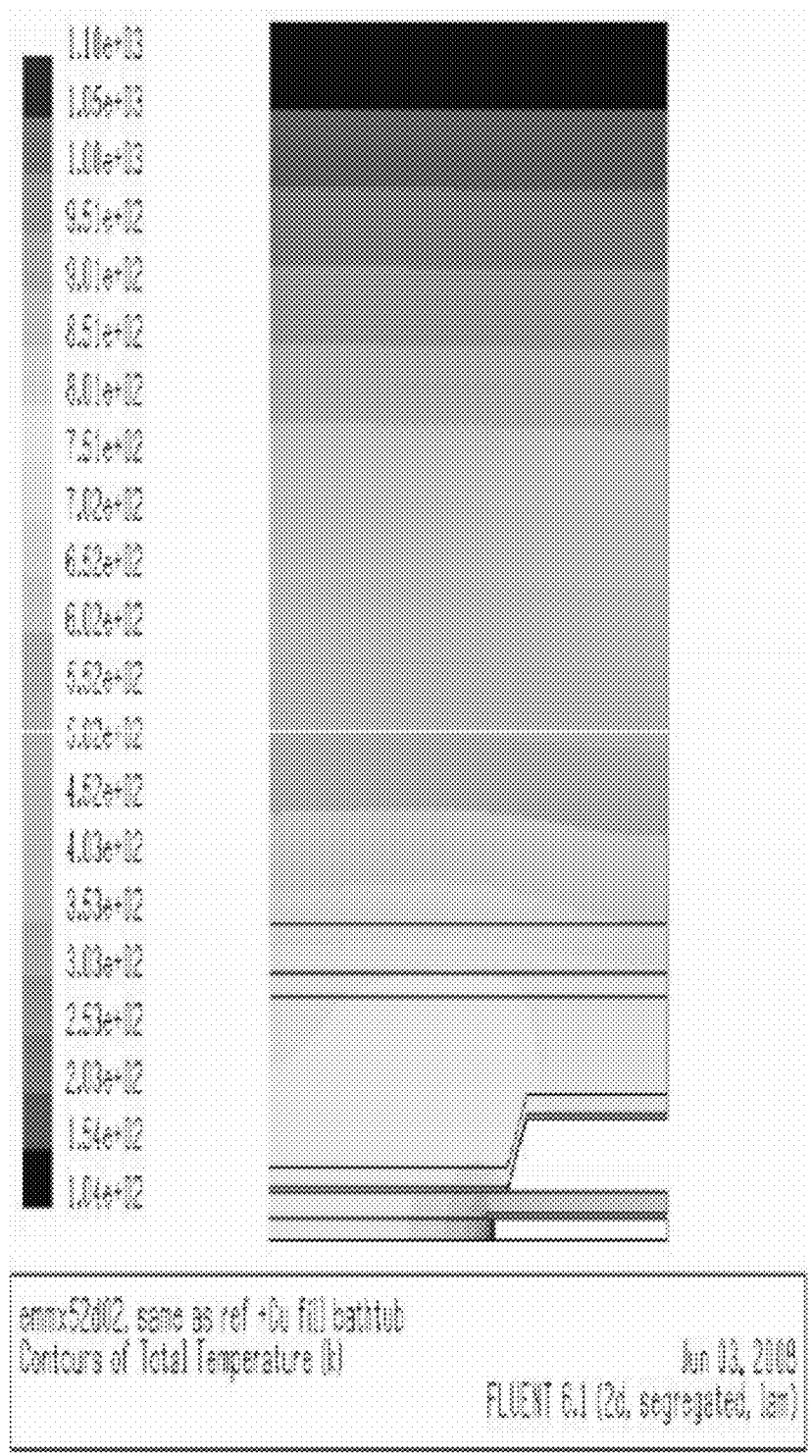

FIG. 9 shows current density graph in accordance with aspects of the invention. These graphs represent a model using a plated copper layer of approximately 10 microns. As shown in the lower graph of FIG. 9 (e.g., FIG. 9a), the current density along the interface of the UBM (including the plated copper layer) and the solder bump shows a flat current density distribution.

Design Structure

Figure 10:
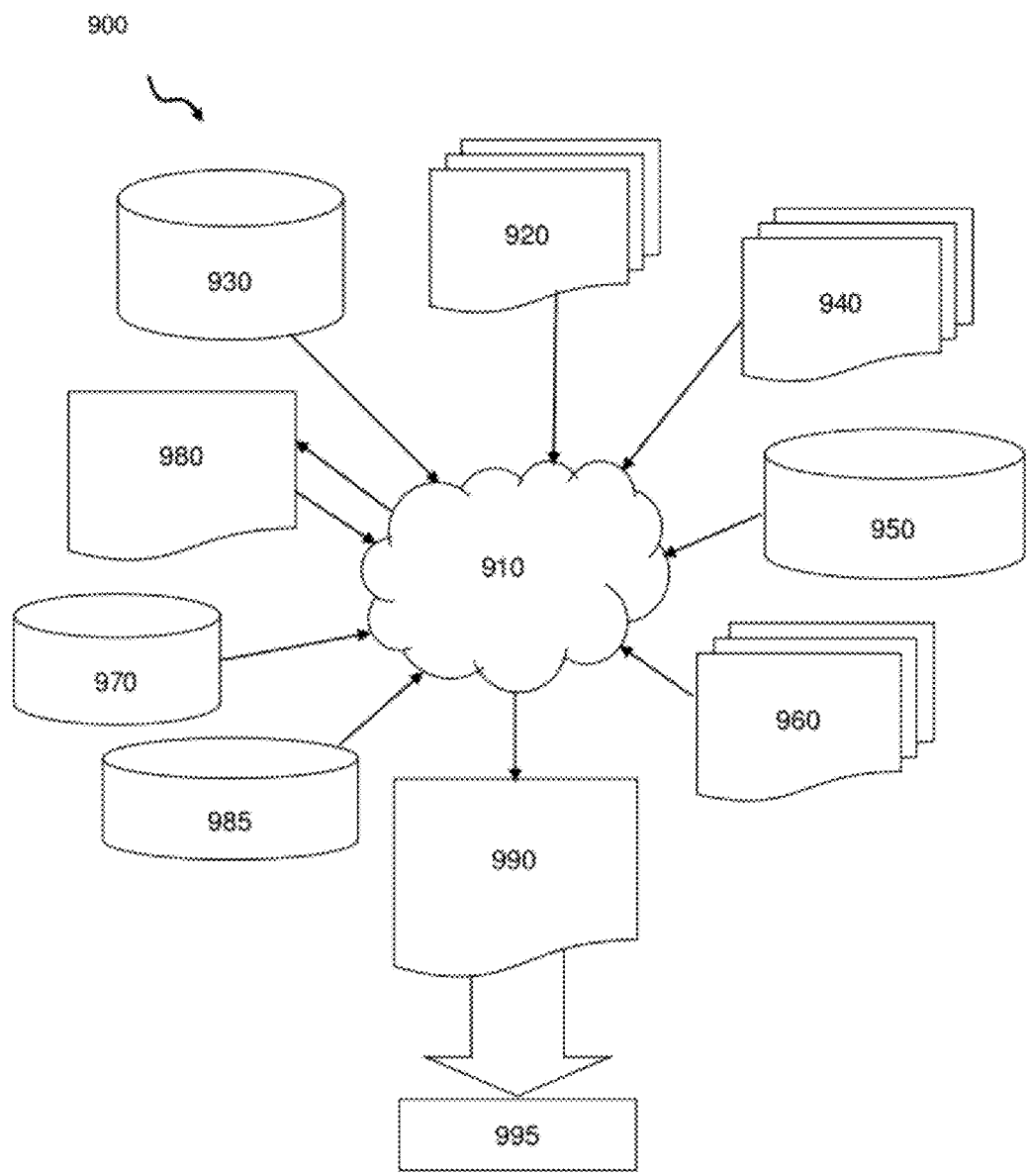
FIG. 10 is a flow diagram of a design process used in semiconductor design, manufacture, and/or test.

FIG. 10 shows a block diagram of an exemplary design flow 900 used for example, in semiconductor IC logic design, simulation, test, layout, and manufacture. Design flow 900 includes processes and mechanisms for processing design structures to generate logically or otherwise functionally equivalent representations of the embodiments of the invention shown in, e.g., FIGS. 1-7. The design structures processed and/or generated by design flow 900 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission or storage medium, design structure 920 may be accessed and processed by one or more hardware and/or software modules within design process 910 to simulate or otherwise functionally represent an electronic component, circuit, electronic or logic module, apparatus, device, or system such as those shown in, e.g., FIGS. 1-7. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in, e.g., FIGS. 1-7, to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include modules for performing standard circuit design processes such as timing analysis, verification, design rule checking, place and route operations, etc.

Design process 910 employs and incorporates well-known logic and physical design tools such as HDL compilers and simulation model build tools to process design structure 920 together with some or all of the depicted supporting data structures to generate a second design structure 990. Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in, e.g., FIGS. 1-7. In one embodiment, design structure 990 may comprise a compiled, executable HDL simulation model that functionally simulates the devices shown in, e.g., FIGS. 1-7.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in, e.g., FIGS. 1-7. Design structure 990 may then proceed to a stage 995 where, for example, design structure 990: proceeds to tape-out, is released to manufacturing, is released to a mask house, is sent to another design house, is sent back to the customer, etc.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A structure comprising:
    an under bump metallurgy formed in a trench, the under bump metallurgy including at least:
        an adhesion layer;
        a sputtered copper layer formed on the adhesion layer;
        a first plated nickel layer formed on the sputtered copper layer;
        a plated barrier layer that is a second plated nickel layer; and
        a plated conductive metal layer that is a first plated copper layer provided between the first plated nickel layer and the plated barrier layer; and
    a solder bump formed on the under bump metallurgy,
    wherein the first plated copper layer comprises a top surface that is entirely planar;
    the second plated nickel layer comprises a top surface that is entirely planar;
    the first plated nickel layer comprises a via depression located within the trench; and
    the sputtered copper layer comprises a via depression located within the trench.

2. The structure of claim 1, wherein:
    the adhesion layer is a TiW layer;
    the second plated nickel layer is formed directly on the first plated copper layer;
    the first plated copper layer is formed directly on the first plated nickel layer;
    the first plated nickel layer is formed directly on the sputtered copper layer;
    the sputtered copper layer is formed directly on the adhesion layer;
    and
    the solder bump is formed directly on the second plated nickel layer.

3. The structure of claim 2, further comprising a second plated copper layer on the second plated nickel layer, wherein the solder bump is provided on the second plated copper layer.

4. The structure of claim 1, wherein:
    the adhesion layer is a TiW layer;
    the second plated nickel layer is formed directly on the first plated copper layer;
    the first plated copper layer is formed directly on the first plated nickel layer; and
    the solder bump is formed on the second plated nickel layer.

5. The structure of claim 1, wherein the plated conductive metal layer has a thickness of about 0.25 microns to 10 microns.

6. The structure of claim 1, wherein an interface of the solder bump and the under bump metallurgy forms a stable intermetallic comprising one of NiSn, CuSn, and NiCuSn which form a higher resistivity and more contiguous layer than $Cu_xSn_y$.

7. The structure of claim 1, wherein the under bump metallurgy spreads out localized current density through the under bump metallurgy thereby reducing or eliminating high current paths through the intermetallic phase on top of the plated barrier layer.

8. The structure of claim 1, further comprising a second under bump metallurgy formed in a second trench, the second under bump metallurgy including at least:
    an adhesion layer;
    a planar plated barrier layer; and
    a plated conductive metal layer provided between the adhesion layer and the plated barrier layer.

9. A structure comprising:
    an under bump metallurgy in a trench, the under bump metallurgy including:
        an adhesion layer on a polyimide layer;
        a sputtered copper layer on the adhesion layer, the sputtered copper layer comprising a via depression located within the trench;
        a first plated nickel layer on the sputtered copper layer, the first plated nickel layer comprising a via depression located within the trench;
        a first plated copper layer on the first plated nickel layer, the first plated copper layer having a planar surface thereby eliminating via depressions, and the first plated copper layer completely filling the via depression of the first plated nickel layer; and
        a second plated nickel layer on the first plated copper layer, the second plated nickel layer having a planar surface thereby eliminating via depressions; and
    a reflowed solder bump on the under bump metallurgy.

10. The structure of claim 9, wherein the adhesion layer is a TiW layer.

11. The method of claim 9, wherein an interface of the solder bump and the under bump metallurgy is a stable intermetallic comprising one of NiSn, CuSn, and NiCuSn which form a higher resistivity and more contiguous layer than $Cu_xSn_y$.

12. The structure of claim 9, further comprising a second plated copper layer on the second plated nickel layer.

13. The structure of claim 9, further comprising:
    a second under bump metallurgy in a second trench, the second under bump metallurgy including:
        a TiW layer in the second trench;
        a second copper layer on the TiW layer;
        a third plated nickel layer on the second copper layer;
        a third plated copper layer on the third plated nickel layer; and
        a fourth plated nickel layer on the third plated copper layer.

14. The structure of claim 13,
    wherein the first trench and the second trench are tapered.

15. A design structure embodied in a machine readable device or memory for designing, manufacturing, or testing an integrated circuit, the design structure comprising:
    an under bump metallurgy formed in a trench, the under bump metallurgy including at least:
        an adhesion layer;
        a sputtered copper layer formed on the adhesion layer;
        a first plated nickel layer formed on the sputtered copper layer;
        a plated barrier layer that is a second plated nickel layer; and a plated conductive metal layer that is a first plated copper layer provided between the first plated nickel layer and the plated barrier layer; and
a solder bump formed on the under bump metallurgy,
wherein the first plated copper layer comprises a top surface that is entirely planar;
the second plated nickel layer comprises a top surface that is entirely planar;
the first plated nickel layer comprises a via depression located within the trench; and
the sputtered copper layer comprises a via depression located within the trench.

* * * * *